(12) United States Patent
Karnik et al.

(10) Patent No.: US 6,483,363 B1
(45) Date of Patent: Nov. 19, 2002

(54) STORAGE ELEMENT WITH STOCK NODE CAPACITIVE LOAD

(75) Inventors: Tanay Karnik, Portland, OR (US); Sriram R. Vangal, Hillsboro, OR (US); Venkat S. Veeramachaneni, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/663,749

(22) Filed: Sep. 15, 2000

(51) Int. Cl.[7] .............................................. H03K 3/356
(52) U.S. Cl. ....................................... 327/211; 327/210
(58) Field of Search ................................. 327/211, 202, 327/203, 210, 212, 337, 200; 326/83, 86, 95

(56) References Cited

U.S. PATENT DOCUMENTS

| | | | | |
|---|---|---|---|---|
| 4,806,786 A | * | 2/1989 | Valentine | 327/203 |
| 5,467,038 A | * | 11/1995 | Motley et al. | 327/202 |
| 5,654,658 A | * | 8/1997 | Kubota et al. | 327/202 |
| 5,821,791 A | * | 10/1998 | Gaibotti et al. | 327/202 |
| 5,973,529 A | * | 10/1999 | Chappell et al. | 327/200 |
| 5,982,211 A | * | 11/1999 | Ko | 327/202 |
| 6,002,284 A | * | 12/1999 | Hill et al. | 327/202 |
| 6,094,385 A | * | 7/2000 | Trimberger | 365/200 |

* cited by examiner

*Primary Examiner*—Timothy P. Callahan
*Assistant Examiner*—Linh Nguyen
(74) *Attorney, Agent, or Firm*—Schwegman, Lundberg, Woessner & Kluth, P.A.

(57) ABSTRACT

A storage element includes a forward inverter and a feedback inverter cross-coupled between a storage node and a feedback node. A capacitive load within the feedback inverter is coupled to the storage node when the storage element holds data and is not coupled to the storage node when the storage element is loading. The capacitive load reduces the storage element's susceptibility to soft errors when holding data, and does not appreciably slow the storage element when data is loading. The capacitive load is implemented using the gate capacitance of complementary transistors connected to stack nodes within the feedback inverter. A flip-flop includes cascaded latches, one or more of which have the internal capacitance.

28 Claims, 6 Drawing Sheets

STORAGE ELEMENT WITH STOCK NODE CAPACITIVE LOAD

FIELD

The present invention relates generally to integrated circuits, and more specifically to integrated circuits having increased soft error rate tolerance.

BACKGROUND

Integrated circuits commonly include storage elements such as latches that retain state information and hold data. During a portion of a time cycle, or clock period, these storage elements hold data to be used during subsequent time cycles. When storage elements reliably retain data, computations can be error free. In contrast, when storage elements do not reliably retain data, computation errors can result.

Cosmic rays and charged particles can cause integrated circuits to be unreliable. When particles bombard portions of integrated circuits, localized areas of charge can build up on an integrated circuit die and cause stored information to be upset. For example, latches having transistors with diffusion regions can be susceptible to bombardment of charged particles. As particles bombard an integrated circuit die about a diffusion region held at a low voltage, the voltage can increase. Likewise, as particles bombard an integrated circuit about a diffusion region held at a high voltage, the voltage can decrease. When the bombardment is significant, the change in voltage in the diffusion region can cause the latch to change state, thereby causing a "soft error" to occur.

The addition of capacitance to a path-exclusive feedback node in a latch circuit is one known method for mitigating the above-described effects. Capacitance provides "capacity" to store a given amount of charge with less voltage change. One drawback of additional capacitance is reduced circuit speed. When the latch circuit changes state, the output voltage value changes, and the additional capacitance is charged as the voltage value changes. Although additional capacitance can reduce the latch circuit's susceptibility to soft errors, the speed of the latch circuit is reduced in part because the additional capacitance is charged as the voltage value changes.

FIG. 1 shows a prior art latch. Latch 100 includes forward inverter 118 and feedback inverter 110 cross-coupled together. Forward inverter 118 drives feedback node 114 which is input to feedback inverter 110. Feedback inverter 110 in turn drives storage node 112 which is input to forward inverter 118. Latch 100 passes data from data input node 102 to data output node 122 when pass gate 104 is closed. Pass gate 104 is closed when the clock signal on node 108 is high, and the inverse clock signal on node 106 is low. Latch 100 holds data when the clock signal on node 108 is low, and the inverse clock signal on node 106 is high.

When latch 100 is holding data, storage node 112 is at a stable logical state of either logical "1" or logical "0," and buffer 120 drives data output node 122. Forward inverter 118 receives the stored data value on storage node 112, and drives feedback node 114 to the opposite logical state than that of storage node 112. Feedback inverter 110 receives the opposite logical state on feedback node 114, and drives storage node 112 with the original stored data value.

Capacitor 116 is coupled to feedback node 114. When charge accumulates on feedback node 114 as a result of cosmic rays or other noise sources, capacitor 116 reduces the voltage variations for a given amount of charge, and reduces the likelihood of a soft error. Along with reducing the likelihood of a soft error, capacitor 116 acts as a low-pass filter, and reduces the speed with which feedback node 114 changes voltage. The addition of buffer (or inverter) 120 allows the data output node 122 to change voltage quickly without regard to the presence of capacitor 116, but also consumes additional area and power.

For the reasons stated above, and for other reasons stated below which will become apparent to those skilled in the art upon reading and understanding the present specification, there is a need in the art for improved integrated circuit elements with reduced susceptibility to soft errors.

DESCRIPTION OF EMBODIMENTS

Figure 1:
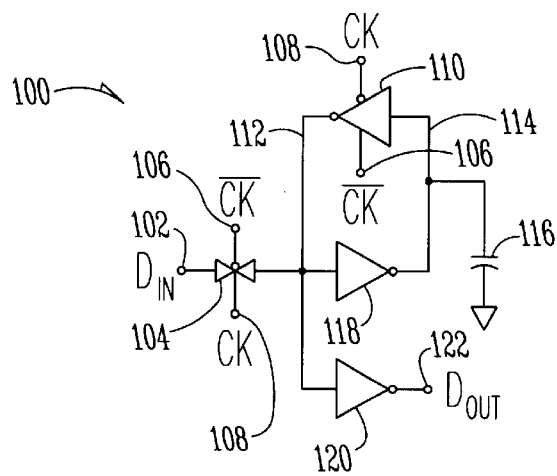
FIG. 1 shows a prior art latch.

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

As used herein, the term NFET describes N channel field effect transistors, of which N channel Metal Oxide Semiconductor (NMOS) FETs are an example, and the term PFET describes P channel field effect transistors, of which P channel Metal Oxide Semiconductor (PMOS) FETs are an example. FET devices include diffusion regions coupled to the drain of the FET and the source of the FET. Diffusion regions can collect charge resulting from cosmic rays and particles that bombard the integrated circuit die. Particles that bombard the bulk of the integrated circuit die can cause negatively charged electrons or positively charged holes to collect in diffusion regions of FETs and cause soft errors.

Figure 2:
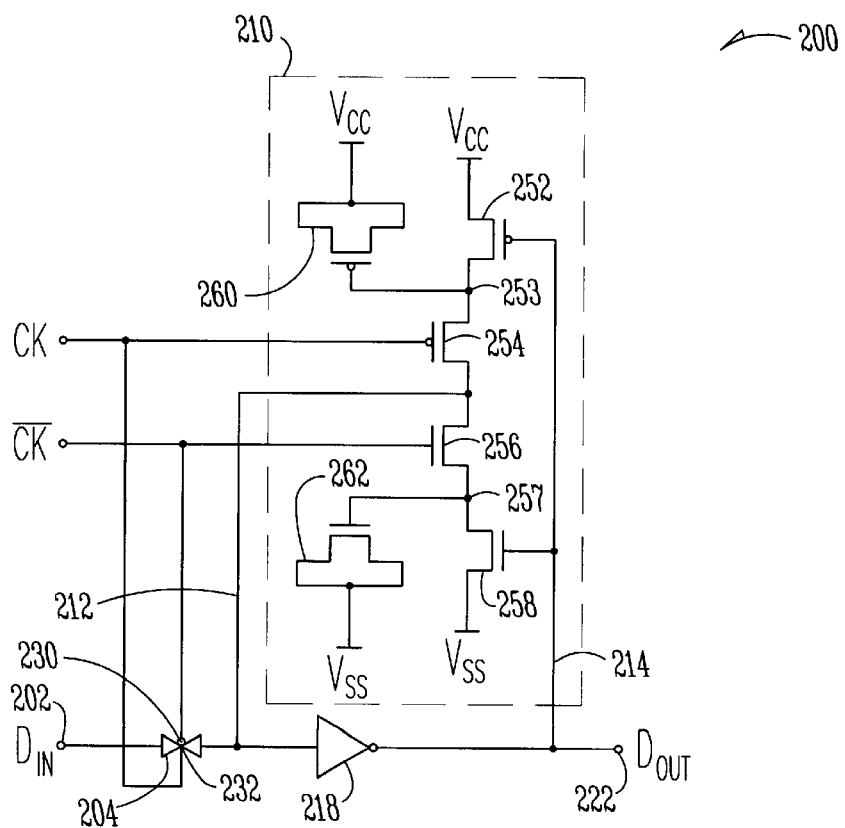
FIG. 2 is a diagram of a latch with stack node capacitors.

FIG. 2 shows a latch according to one embodiment of the present invention. Latch 200 includes forward inverter 218, feedback inverter 210, and pass gate 204. Inverters 218 and 210 are cross-coupled such that when in steady-state, they latch a data value. When the output of feedback inverter 210 is a logical "0," the input of forward inverter 218 is also a logical "0." The output of forward inverter 218 is a logical "1," which causes the output of feedback inverter 210 to remain in its present state of logical "0." One can see, therefore, that cross-coupled inverters 210 and 218 work to latch a logical state. Forward inverter 218 drives data output node 222.

Various embodiments of circuits are described with reference to circuit nodes having states of logical "1" and logical "0." Circuit nodes are also described as having high voltage and low voltage signals applied thereto. The terms logical "1" and logical "0" generally correspond to a high voltage and a low voltage, respectively. The "logical" terms are used when describing the logical operation of a circuit, and the "voltage" terms are used when describing the circuit more filly. One skilled in the art will understand that a logical inversion can take place while still practicing the present invention. For example, the term logical "1" can correspond to a low voltage, and the term logical "0" can correspond to a high voltage without departing from the scope of the present invention.

Various nodes in latch 200 are shown driven by complementary signals labeled "CK" and "$\overline{CK}$," referred to herein as "the clock signal" and "the inverse of the clock signal," respectively. For example, the gates of PFET 254 and NFET 256 of feedback inverter 210 are shown driven by the clock signal and the inverse of the clock signal, respectively. Also for example, control input nodes 232 and 230 of pass gate 204 are shown driven by the clock signal, and the inverse of the clock signal, respectively. When the clock signal is a logical "1," the inverse of the clock signal is a logical "0." For the purposes of this description, the clock signal and the inverse of the clock signal are sometimes referred to as a single "clock" signal. For example, when the clock signal is referred to as being "high," or as being at a logical "1," this describes the clock signal having a logical state of "1," and the inverse of the clock signal having a logical state of"0." Conversely, when the clock signal is referred to as being "low," or as being at a logical "0," this describes the clock signal having a logical state of "0," and the inverse of the clock signal having a logical state of "1."

Feedback inverter 210 includes PFETs 252, 254, and 260, and also includes NFETs 256, 258, and 262. Feedback inverter 210 is a "clocked inverter" that operates as an inverter when the clock signal is low, and operates as an open circuit when the clock signal is high. As previously described, the gates of PFET 254 and NFET 256 are driven by the clock signal and the inverse of the clock signal, respectively. When the clock signal is high, PFET 254 and NFET 256 turn off and feedback inverter 210 becomes an open circuit. When the clock signal is low, PFET 254 and NFET 256 turn on and feedback inverter 210 operates as an inverter. PFETs 252 and 254 are series connected "pullup" devices that form a "stack," and the node formed at the junction between them is referred to as P-stack node 253. Likewise, NFETs 256 and 258 are series connected "pull-down" devices that form a stack, and the node formed at the junction between them is referred to as N-stack node 257.

PFET 260 includes a gate coupled to P-stack node 253 and a source and drain coupled to a voltage supply node labeled Vcc. PFET 260 forms a "PMOS capacitor" on P-stack node 253 that has a capacitance value that varies as a function of voltage across the device. The voltage dependent capacitance of the PMOS capacitor is described in more detail with reference to FIG. 4B below. NFET 262 includes a gate coupled to N-stack node 257, and a source and drain coupled to a voltage supply node labeled Vss. NFET 262 forms an "NMOS capacitor" on N-stack node 257 that has a capacitance value that varies as a function of voltage across the device. The voltage dependent capacitance of the NMOS capacitor is described in more detail with reference to FIG. 4A below.

The capacitance provided by PFET 260 and NFET 262 is a capacitance internal to feedback inverter 210, and is also a capacitance that can conditionally be present on storage node 212. The "internal capacitance" provided by PFET 260 and NFET 262 appears on storage node 212 when the clock signal is low and PFET 254 and NFET 256 are on. Conversely, the internal capacitance is isolated from storage node 212 when the clock signal is high. This is described in more detail with reference to FIGS. 3A and 3B below.

Pass gate 204 is a transmission gate that passes a signal from one side to the other when signals on the control input nodes are at specific states. In the embodiment of FIG. 2, pass gate 204 has complementary control input nodes driven by the clock signal and the inverse of the clock signal. For example, pass gate 204 has positive control input node 232 driven by the clock signal, and has negative control input node 230 driven by the inverse of the clock signal. Pass gate 204 is closed when the positive control input node is driven high, and the negative control input node is driven low. Conversely, pass gate 204 is open when the positive control input node is driven low and the negative control input node is driven high. In other embodiments, different types of pass gates are used. For example, it is not necessary that pass gate 204 have complementary control input nodes.

Latch 200 is loaded when pass gate 204 is closed as a result of the clock signal being asserted high. When pass gate 204 is closed, data input node 202 (labeled Din in FIG. 2) is coupled to storage node 212. The input of forward inverter 218 is driven with the data present on data input node 202. If the data is the same as the previous data stored on storage node 212, then the output of forward inverter 218 does not change state. If the data is not the same as the previous data on storage node 212, the output of forward inverter 218 changes state. During the load operation, the clock signal is high, feedback inverter 210 is not in the circuit, and the internal capacitance provided by PFET 260 and NFET 262 is isolated from storage node 212.

Because the internal capacitance is isolated from storage node 212 and feedback node 214 during a load operation, data on data output node 222 (labeled Dout in FIG. 2) can respond quickly to changes of data on data input node 202. As a result, propagation delays in latch 200 are kept low during a load operation.

When the clock signal transitions from high to low, pass gate 204 changes state, and feedback inverter 210 turns on and becomes cross-coupled with forward inverter 218, thereby forming a latch. Pass gate 204 opens and isolates data input node 202 from storage node 212. The internal capacitance provided by PFET 260 and NFET 262 presents a capacitive load on storage node 212 that allows latch 200 to be more tolerant of charge accumulation. As charge builds up on any components coupled to storage node 212, for example on the diffusion regions on the transistors of feedback inverter 210, the internal capacitance accepts the charge while allowing the voltage on storage node 212 to change more slowly. As a result, latch 200 is more tolerant of charge accumulation, and soft errors are less likely to occur.

The conditional presence of the internal capacitance on storage node 212 has little effect on the performance of latch 200 as measured by a clock-to-output time and a data set-up time. Because the capacitance is coupled to storage node 212 only when the clock signal is low and data is latched, the clock-to-output time is not adversely affected. When latch 200 is loading, and the input pass gate is on, no additional capacitance appears on storage node 212 as a result of the internal capacitance, so data propagates through forward inverter 218 onto data output node 222 at the same rate as it would without the addition of the internal capacitance provided by PFET 260 and NFET 262.

Figure 3A:
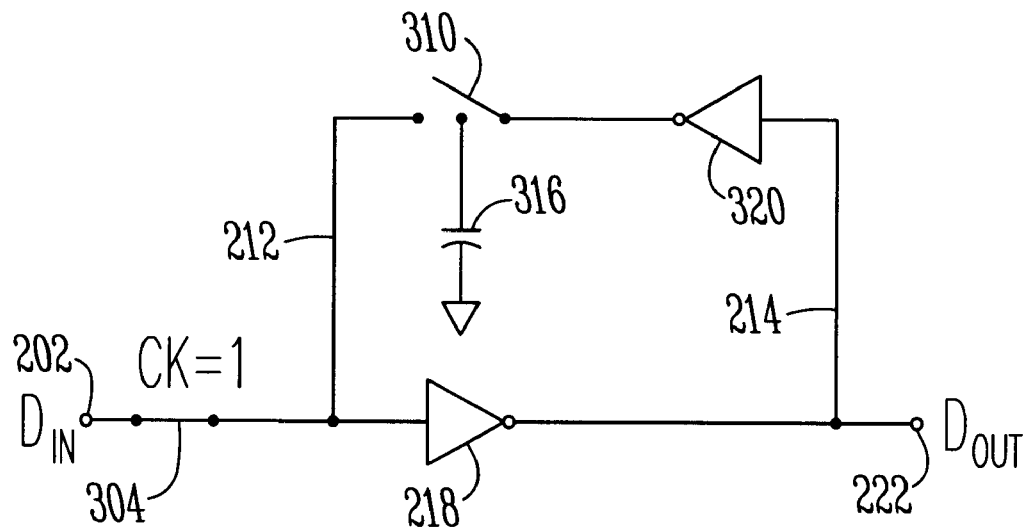
FIGS. 3A and 3B are diagrams showing different logical states of the latch of FIG. 2.
Figure 3B:
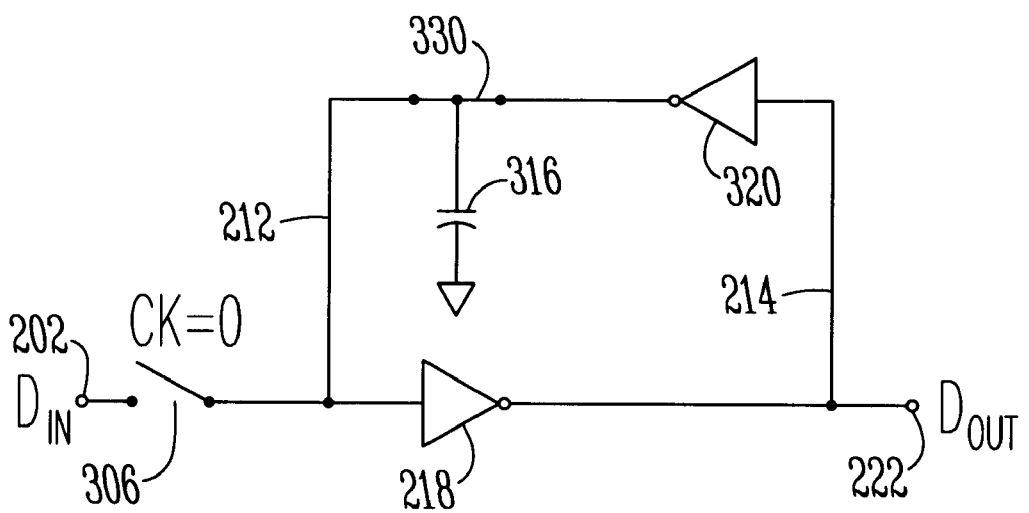

FIGS. 3A and 3B schematically show the state of latch 200 when it is loading, and when it is latched, respectively. FIG. 3A shows the state of latch 200 when the clock signal is high and the inverse of the clock signal is low. Pass gate 204 is shown as closed switch 304, and feedback inverter 210 is shown as inverter 320 in series with open switch 310. The internal capacitance of feedback inverter 210 is shown as capacitor 316 isolated from storage node 212 by open switch 310. Because feedback inverter 210 and capacitor 316 are not in the circuit, the circuit behaves as an inverter with input data driven on data input node 202 and output data on data output node 222. Data on data input node 202 can quickly drive the input to forward inverter 218 because the drive strength of the feedback inverter need not be overcome, and also because no additional capacitance is on storage node 212.

FIG. 3B shows the state of latch 200 when the clock signal is low and the inverse of the clock signal is high. This occurs when latch 200 is no longer loading, but instead, is latched. Pass gate 204 is shown as open switch 306, and feedback inverter 210 is shown as inverter 320 in series with closed switch 330 which couples storage node 212 to capacitor 316. Because feedback inverter 210 is now in the circuit, the circuit behaves as a latch with cross-coupled inverters holding state information. Because capacitor 316 is in the circuit, storage node 212 is more tolerant of charge accumulation, and fewer soft errors result.

Figure 4A:
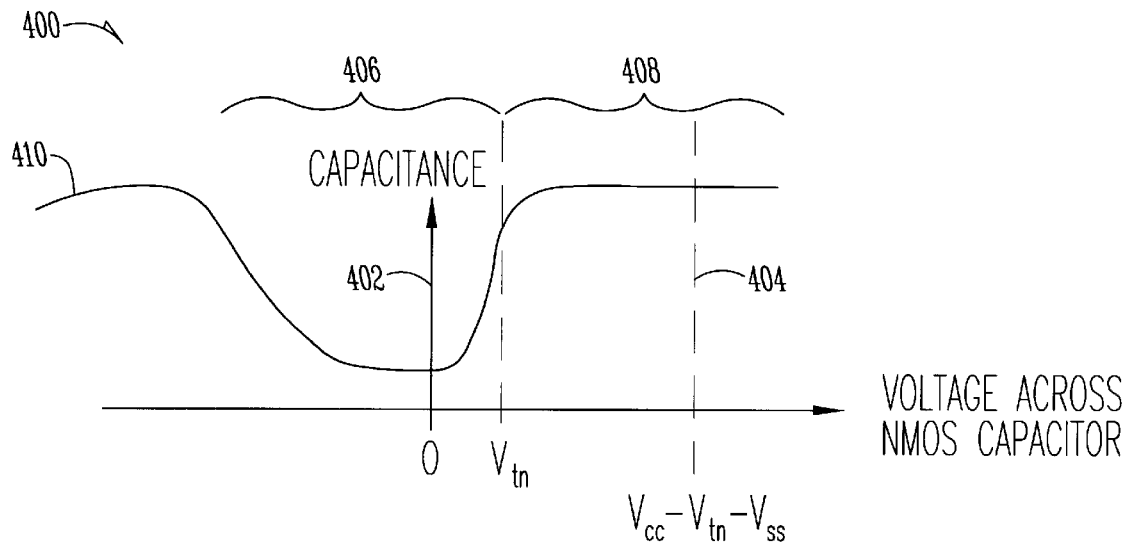
FIGS. 4A and 4B are capacitance curves for stack node capacitors.

FIG. 4A shows the capacitance of an NMOS capacitor as a function of voltage across the device. For example, as shown in plot 400, capacitance curve 410 represents the capacitance value of NFET 262 as a function of the voltage between two terminals. The first terminal is the gate of NFET 262, and the source and drain of NFET 262 are connected to form the second terminal. Two regions are defined generally in plot 400 as depletion region 406 and inversion region 408. Depletion region 406 is entered when the voltage across the device is below Vtn, which is the threshold voltage of NFET 262. When in depletion, the majority charge carriers are depleted from the channel between the source and drain, and the capacitance of the device is lower. For NFETs, the charge carriers in the channel are electrons, and in depletion region 406, electrons are depleted from the channel. When in inversion, the voltage across the device is above Vtn, and the electrons are present in the channel of the device. When an NFET is in the inversion region, the channel is not depleted of electrons and the capacitance of the device is higher.

In an inverter with stack node capacitors, such as feedback inverter 210 (FIG. 2), the stack node capacitors have, in general, two operating points corresponding to the two states of feedback inverter. For example, referring now back to FIG. 2, when feedback node 214 is high, storage node 212 is low. This corresponds to NFET 258 being on, and N-stack node 257 having a voltage of substantially Vss. When N-stack node 257 is at Vss, the voltage across NFET 262 is substantially zero. This is the first of two operating points, and is shown at 402 in FIG. 4A. When feedback node 214 is low, storage node 212 is high. This corresponds to NFET 258 being off, and N-stack node 257 having a voltage of substantially (Vcc−Vtn) because storage node 212 is at substantially Vcc and the voltage drop across NFET 256 is approximately Vtn. When N-stack node 257 has a voltage of (Vcc−Vtn), NFET 262 has a voltage of (Vcc−Vtn−Vss) across the device. This is the second of two operating points, and is shown at 404 in FIG. 4A.

The two operating points of NFET 262 correspond to the low capacitance depletion region, and the higher capacitance inversion region. For example, operating point 402 occurs when inverter 210 has an output voltage of substantially Vss volts, and the capacitor formed by NFET 262 is in the lower capacitance depletion region 406. Also for example, operating point 404 occurs when inverter 210 has an output voltage of substantially Vcc volts, and the capacitor formed by NFET 262 is in the higher capacitance inversion region 408.

In some embodiments, Vcc is equal to one volt, Vss is equal to zero volts, or "ground," and Vtn is equal to 0.25 volts. In these embodiments, the two operating points of NFET 262 are zero volts and 0.75 volts as measured from the gate of NFET 262 to the combined source/drain terminal.

Figure 4B:
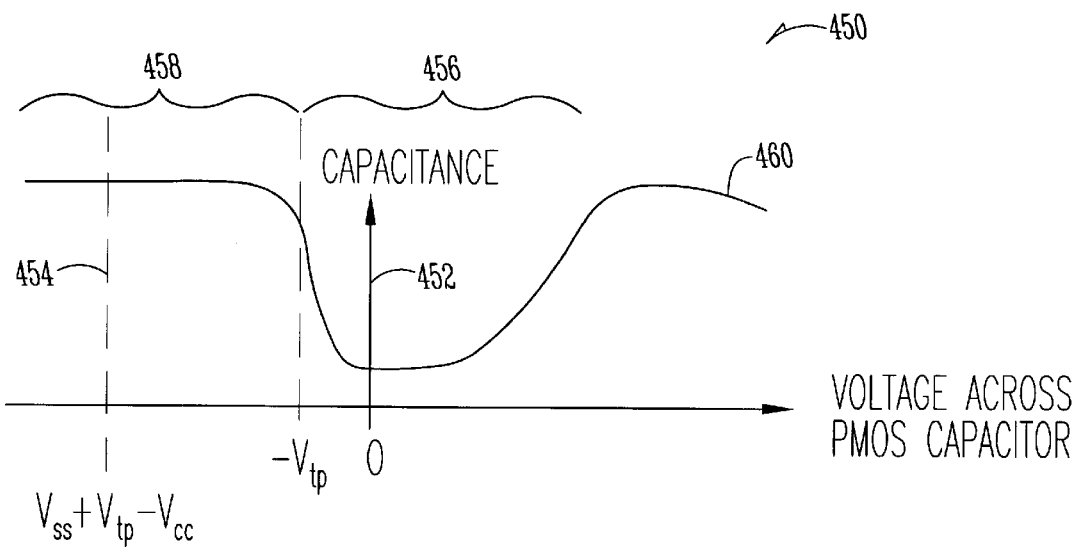

FIG. 4B shows the capacitance of a PMOS capacitor as a function of voltage across the device. For example, as shown in plot 450, capacitance curve 460 represents the capacitance value of PFET 260 as a function of the voltage between two terminals. The first terminal is the gate and the second terminal is formed by the combination of the source and drain. Two regions are defined generally in plot 450 as depletion region 456 and inversion region 458. Depletion region 406 is entered when the voltage across the device is above −Vtp, which is the threshold voltage of PFET 260. When in depletion, the majority charge carriers are depleted from the channel between the source and drain, and the capacitance of the device is lower. For PFETs, the charge carriers in the channel are holes, and in depletion region 456, holes are depleted from the channel. When in inversion, the voltage across the device is below −Vtp, and the holes are present in the channel of the device. When a PFET is in the inversion region, the channel is not depleted of holes and the capacitance of the device is higher.

Like the capacitor formed by NFET 262, the capacitor formed by PFET 260 also has, in general, two operating points corresponding to the two states of inverter 210. For example, referring now back to FIG. 2, when feedback node 214 is low, storage node 212 is high. This corresponds to PFET 252 being on, and P-stack node 253 having a voltage of substantially Vcc. When P-stack node 253 is at Vcc, the voltage across PFET 260 is substantially zero. This is the first of two operating points, and is shown at 452 in FIG. 4B. When feedback node 214 is high, storage node 212 is low. This corresponds to PFET 252 being off, and P-stack node 253 having a voltage of substantially (Vss+Vtp) because storage node 212 is at substantially Vss and the voltage drop across PFET 254 is approximately Vtp. When P-stack node 253 has a voltage of (Vss+Vtp), PFET 260 has a voltage of (Vss+Vtp−Vcc) across the device. This is the second of two operating points, and is shown at 454 in FIG. 4B.

The two operating points of PFET 260 correspond to the low capacitance depletion region, and the higher capacitance inversion region. For example, operating point 452 occurs when inverter 210 has an output voltage of substantially Vcc volts, and the capacitor formed by PFET 260 is in the lower capacitance depletion region 456. Also for example, operating point 454 occurs when inverter 210 has an output voltage of substantially Vss volts, and the capacitor formed by PFET 260 is in the higher capacitance inversion region 458. Using the example given above with Vcc equal to one volt and Vss equal to zero volts, the two operating points of PFET 260 are zero volts and negative 0.75 volts.

The operating points of PFET 260 and NFET 262 complement each other in a manner that helps to reduce the susceptibility to soft errors. For example, when storage node 212 is at Vss, NFET 262 has low capacitance and PFET 260 has higher capacitance. The higher capacitance of PFET 260 can mitigate the effects of charge accumulation in diffusion regions close to P-stack node 253, and as a result, lessen the likelihood of a soft error when storage node 212 is at Vss. Likewise, when storage node 212 is at Vcc, PFET 260 has low capacitance and NFET 262 has a higher capacitance. The higher capacitance of NFET 262 can mitigate the effects of charge accumulation in diffusion regions close to N-stack node 257, and as a result, lessen the likelihood of a soft error when storage node 212 is at Vcc.

Figure 5:
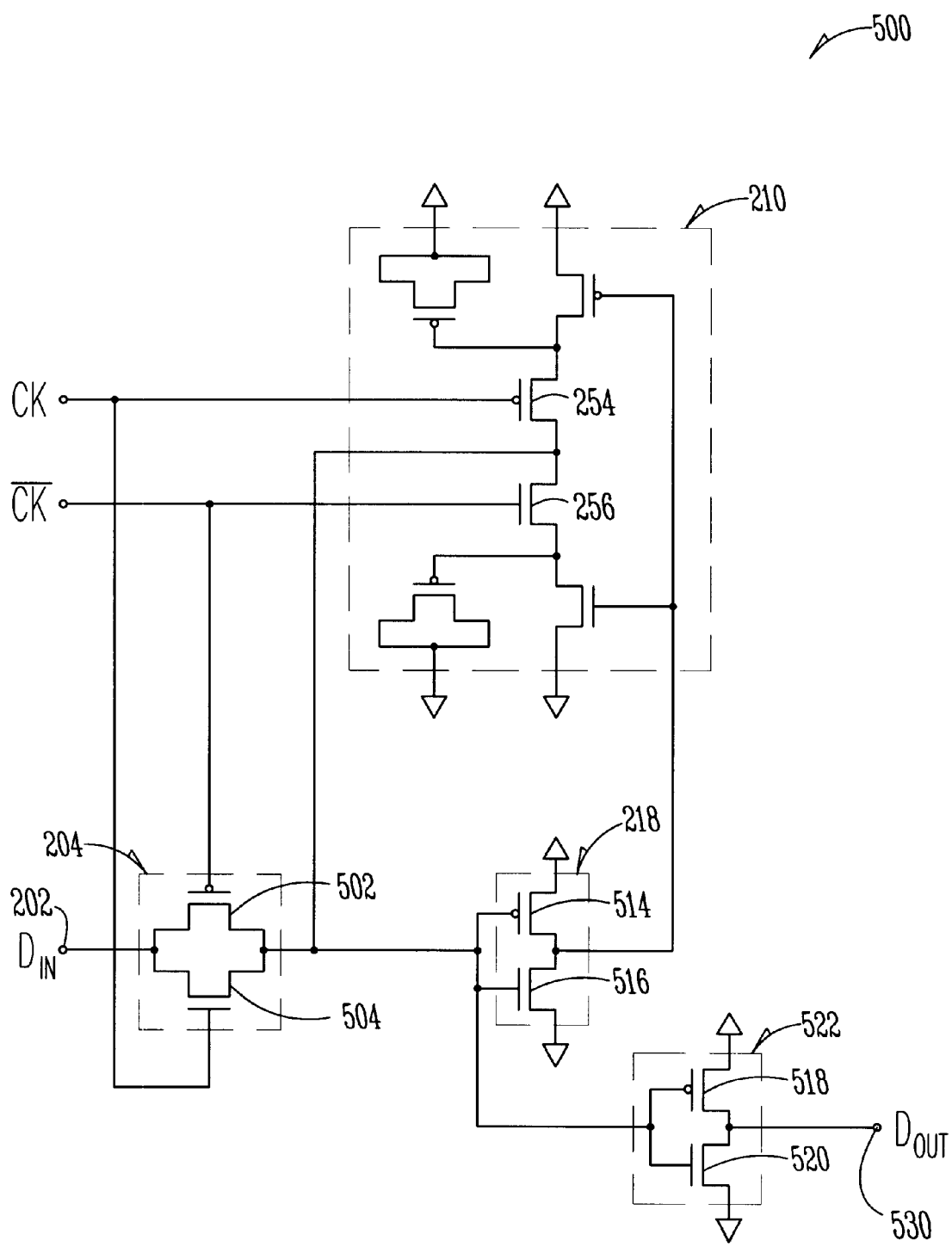
FIG. 5 is a diagram of another latch with stack node capacitors.

FIG. 5 is a diagram of another latch with stack node capacitance. Latch 500 implements all of latch 200 (FIG. 2), and also includes inverter 522. Reference numerals from FIG. 2 are included to show which portions of latch 500 correspond to elements in latch 200. For example, pass gate 204 is implemented as PFET 502 in parallel with NFET 504. Forward inverter 218 is implemented with PFET 514 and NFET 516, and feedback inverter 210 is implemented in the same manner as shown in FIG. 2.

When the clock is high, PFET 502 and NFET 504 are on, and PFET 254 and NFET 256 are off. This is the load condition shown in FIG. 3A. Pass gate 204 is a closed switch, and feedback inverter 210 is removed from the circuit. When the clock is low, the PFETs and NFETs driven by the clock signal and the inverse of the clock signal change state, and the latch holds data. This condition is shown in FIG. 3B. Pass gate 204 is an open switch, and feedback inverter 210 is in the circuit with the stack node capacitance devices providing a capacitive load to storage node 212. Inverter 522 can be any type of buffer capable of driving data output node 530. In the embodiment of FIG. 5, inverter 522 is an inverting buffer. In other embodiments, inverter 522 is a non-inverting buffer.

Figure 6:
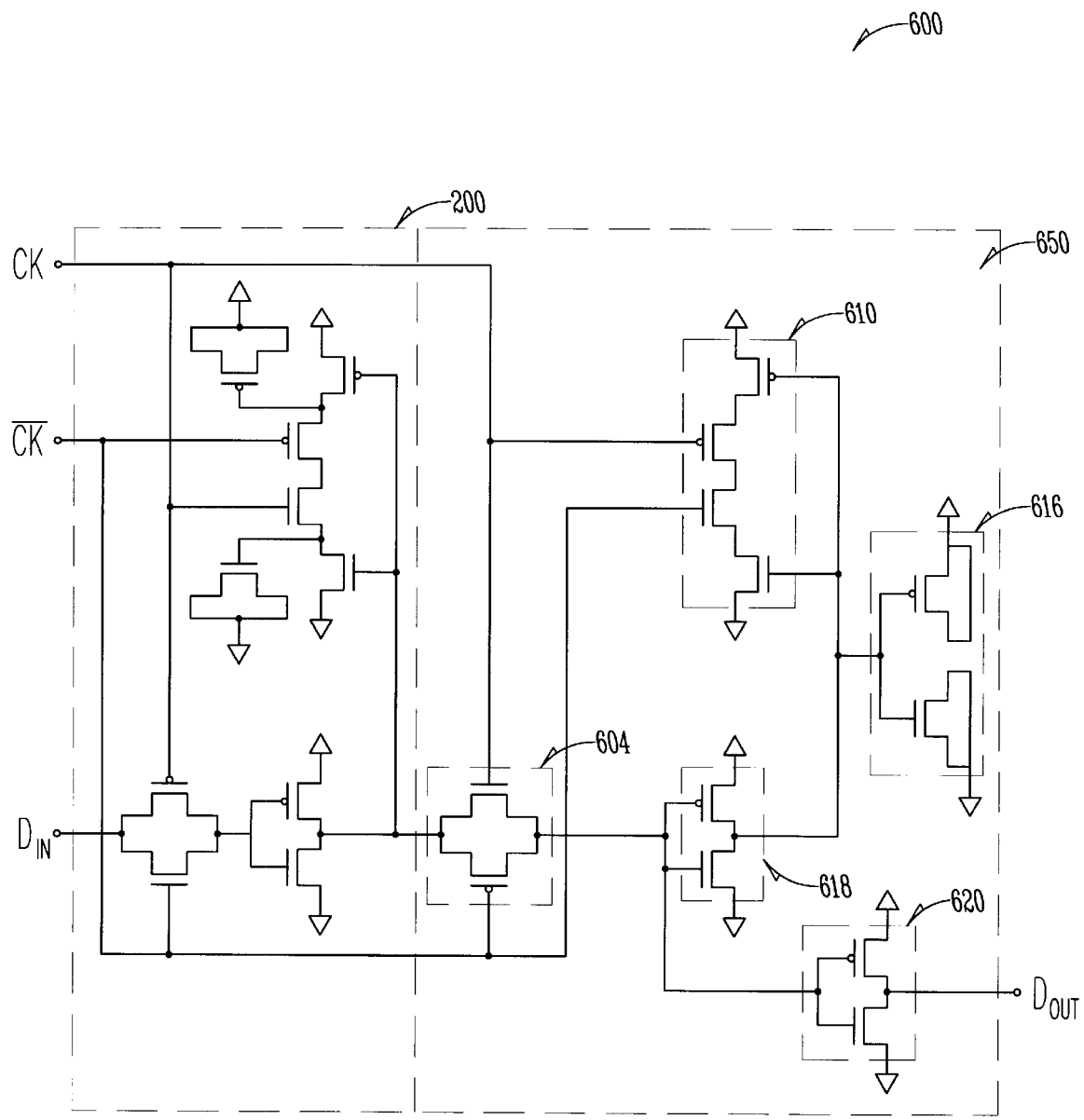
FIG. 6 is a diagram of a flip-flop.

FIG. 6 shows a flip-flop according to an embodiment of the present invention. Flip-flop 600 includes two latches: a master latch and slave latch cascaded together. Latch 200 operates as the master latch and, in some embodiments, is the same latch as shown in FIG. 2. Latch 650 is the slave latch. Latch 650 includes pass gate 604, forward inverter 618, feedback inverter 610, capacitor 616, and buffer 620. In the flip-flop embodiment shown in FIG. 6, both latches 200 and 650 include capacitance on internal nodes to reduce susceptibility to charge accumulation. In latch 200, the capacitor is conditionally coupled to the storage node as described above. In latch 650, the capacitor is directly connected to the feedback node. Also in latch 650, buffer 620 isolates capacitor 616 from the data output node.

In some embodiments, flip-flop 600 includes two latches 200 cascaded, rather than latch 200 and latch 650 as shown in FIG. 6. In these embodiments, both the master and slave latch include clocked inverters with internal capacitance that is conditionally coupled to the storage node. In other embodiments, a latch with a buffer and the conditional capacitance is used as the slave latch. For example, in some embodiments, latch 200 (FIG. 2) drives latch 500 (FIG. 5) to create a flip-flop. Many possible flip-flop embodiments exist as permutations of cascaded latches, and these embodiments are intended to be within the scope of the present invention.

Figure 7:
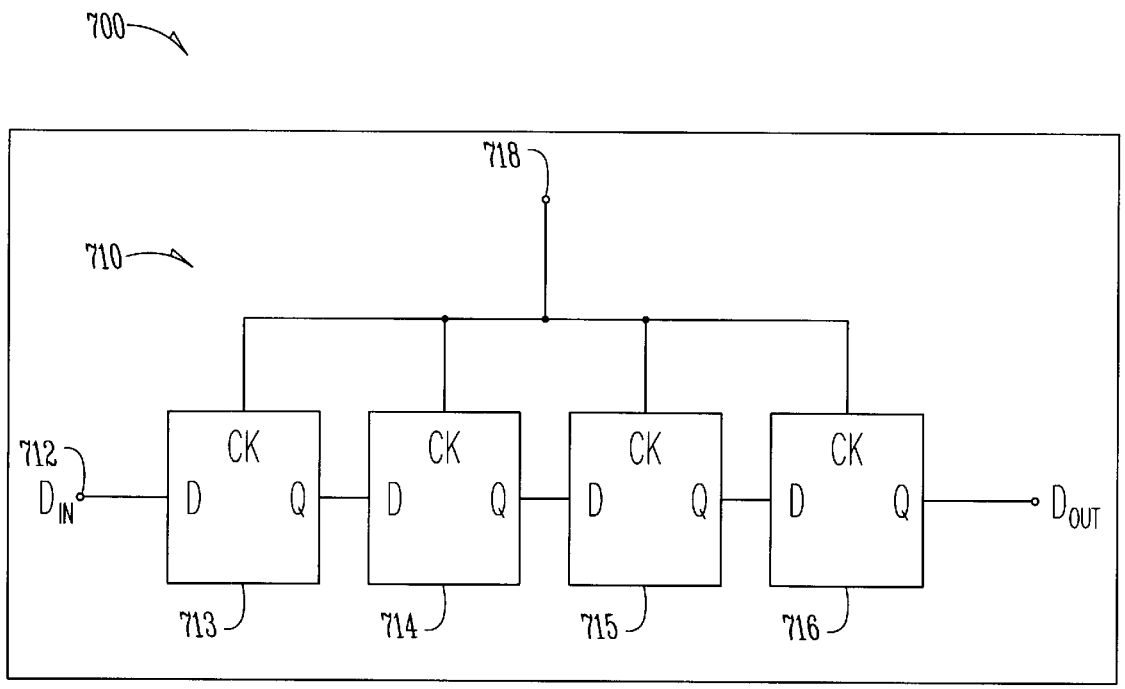
FIG. 7 is a diagram of an integrated circuit.

FIG. 7 shows an integrated circuit in accordance with one embodiment of the present invention. Integrated circuit 700 includes data path 710, which in turn includes storage elements 713, 714, 715, and 716. Storage elements 713–716 can be any embodiment disclosed herein, such as latch 200 or flip-flop 600. Storage element 713 receives data on data input node 712 which corresponds to a data input node such as data input node 202 (FIG. 2). Storage element 713 outputs data which is then input to storage element 714. After storage element 714, the data travels to storage element 715 and storage element 716 in a like manner. Storage elements 713–716 receive a clock signal on clock node 718. The clock signal shown in FIG. 7 corresponds to the clock signals shown in previous figures. In some embodiments, for example when storage elements 713–716 are latches, storage elements 713 and 715 respond to one edge of a clock signal on clock node 718, and storage elements 714 and 716 respond to the opposite edge of the clock signal on clock node 718. In other embodiments, for example when all of storage elements 713–716 are flip-flops, all of storage elements 713–716 respond to the same edge of the clock signal.

Integrated circuit 700 can be any integrated circuit capable of including a storage element such as latch 200 (FIG. 2) or flip-flop 600 (FIG. 6). Integrated circuit 700 can be a processor such as a microprocessor, a digital signal processor, a microcontroller, or the like. Integrated circuit 700 can also be an integrated circuit other than a processor such as an application-specific integrated circuit (ASIC), a communications device, a memory controller, or a memory such as a dynamic random access memory (DRAM).

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An inverter comprising:
   a data input node, a data output node, a clock input node, and an inverse clock input node;
   first and second series pullup devices, the first series pullup device having a control input node coupled to the data input node, and the second series pullup device having a control input node coupled to the clock input node;
   first and second series pulldown devices, the first series pulldown device having a control input node coupled to the data input node, and the second series pulldown device having a control input node coupled to the inverse clock input node; and
   a capacitive load device coupled to a junction between the first and second series pullup devices.

2. The inverter of claim 1 further comprising a second capacitive load device coupled to a junction between the first and second series pulldown devices.

3. The inverter of claim 2 wherein the first and second series pullup devices are PFETs, and the capacitive load device comprises a PFET device having:
   a gate coupled to the junction between the first and second series pullup devices; and
   a source and drain coupled to a first voltage reference node.

4. The inverter of claim 3 wherein the first and second series pulldown devices are NFETs, and the capacitive load comprises an NFET device having:
   a gate coupled to the junction between the first and second pulldown devices; and a source and drain coupled to a second voltage reference node.

5. The inverter of claim 1 wherein the second series pullup device and the second series pulldown device are coupled together to form the output node such that the first and second capacitive load devices are coupled to the output node when the second series pullup device and the second series pulldown device are turned on.

6. An inverter circuit comprising:
   first and second series pullup devices, one being responsive to a data signal, and the other being responsive to a clock signal;
   first and second series pulldown devices, one being responsive to the data signal and the other being responsive to the clock signal;
   a first capacitor coupled between the first and second pullup devices; and
   a second capacitor coupled between the first and second pulldown devices.

7. The inverter circuit of claim 6 wherein:
   the first and second series pullup devices and the first capacitor comprise PFET devices; and
   the first and second series pulldown devices and the second capacitor comprise NFET devices.

8. The inverter circuit of claim 6 wherein the first capacitor comprises a PMOSFET having:
   a gate coupled to a junction between the first and second pullup devices; and
   a source and a drain coupled to a first voltage reference node.

9. The inverter of claim 8 wherein the second capacitor comprises an NMOSFET having:
   a gate coupled to a junction between the first and second pulldown devices; and
   a source and a drain coupled to a second voltage reference node at a lower potential than the first voltage reference node.

10. A latch circuit comprising:
    a forward inverter having an input node coupled to a storage node, and an output node coupled to a feedback node; and
    a feedback inverter having an input node coupled to the feedback node, and an output node coupled to the storage node, and an internal capacitance conditionally coupled to the output node of the feedback inverter, wherein the feedback inverter comprises a pair of series connected PFET devices coupled to a pair of series connected NFET devices, and the internal capacitance comprises a PFET having a gate coupled to a junction between the pair of series connected PFET devices, and an NFET having a gate coupled to a junction between the pair of series connected NFET devices.

11. A latch circuit comprising:
    a forward inverter having an input node coupled to a storage node, and an output node coupled to a feedback node; and
    a feedback inverter having an input node coupled to the feedback node, and an output node coupled to the storage node, and an internal capacitance conditionally coupled to the output node of the feedback inverter, wherein the feedback inverter comprises a pair of series connected pullup devices and a pair of series connected pulldown devices, and wherein the internal capacitance comprises a PMOSFET having a gate coupled to a junction between the pair of series connected pullup devices, and an NMOSFET having a gate coupled to a junction between the pair of series connected pulldown devices.

12. The latch circuit of claim 11 further including a buffer having an input node coupled to the storage node, and having an output node coupled to an output node of the latch circuit.

13. A flip-flop circuit comprising:
    a first latch including a first forward inverter and a first feedback inverter cross-coupled between a first storage node and a first feedback node, the first feedback inverter including a conditional capacitance on the output; and
    a second latch including a second storage node coupled to the first feedback node through a pass gate, and second cross-coupled inverters coupled between the second storage node and a second feedback node, wherein the first feedback inverter comprises:
        first and second PMOSFETs coupled in series between a first voltage reference node and the first storage node, a junction between the first and second PMOSFETs having a first capacitive load device thereon; and
        first and second NMOSFETs coupled in series between the storage node and a second voltage reference node, a junction between the first and second NMOSFETs having a second capacitive load device thereon.

14. The flip-flop circuit of claim 13 wherein:
    the first capacitive load device comprises a PMOSFET having a gate coupled to the junction between the first and second PMOSFETs, and having a source and drain coupled to a third voltage reference node; and
    the second capacitive load device comprises an NMOSFET having a gate coupled to the junction between the first and second NMOSFETs, and having a source and drain coupled to a fourth voltage reference node.

15. The flip-flop circuit of claim 14 wherein the first voltage reference node and the third voltage reference node are the same, and the second voltage reference node and the fourth voltage reference node are the same.

16. The flip-flop circuit of claim 14 wherein:
    the first PMOSFET is coupled between the first voltage reference node and the second PMOSFET, the first PMOSFET having a gate coupled to the first feedback node, the second PMOSFET having a gate coupled to a first clock input node; and
    the first NMOSFET is coupled between the second voltage reference node and the second NMOSFET, the first NMOSFET having a gate coupled to the first feedback node, the second NMOSFET having a gate coupled to a second clock input node.

17. An integrated circuit including a data path, the data path including at least one storage element, the at least one storage element comprising:
    a forward inverter coupled between a storage node and a feedback node; and
    a clocked feedback inverter cross-coupled with the forward inverter, the clocked feedback inverter having an internal capacitive load device to be conditionally coupled to the storage node, wherein the internal capacitive load device comprises a gate of a MOSFET, a source and drain of the MOSFET being coupled to a voltage reference node.

18. The integrated circuit of claim 17 wherein the integrated circuit is a microprocessor.

19. The integrated circuit of claim 17 wherein the integrated circuit is a memory device.

20. The latch circuit of claim 10 wherein the PFET of the internal capacitance includes source and drain terminals coupled to a first voltage reference node.

21. The latch circuit of claim 20 wherein the NFET of the internal capacitance includes source and drain terminals coupled to a second voltage reference node.

22. The latch circuit of claim 10 further comprising a first clock input node coupled to a gate of one of the series connected PFET devices.

23. The latch circuit of claim 22 further comprising a second clock input node coupled to a gate of one of the series connected NFET devices.

24. The latch circuit of claim 23 further comprising a pass gate coupled to both the first and second clock input nodes.

25. The latch circuit of claim 11 wherein the PMOSFET of the internal capacitance includes source and drain terminals coupled to a first voltage reference node.

26. The latch circuit of claim 25 wherein the NMOSFET of the internal capacitance includes source and drain terminals coupled to a second voltage reference node.

27. The latch circuit of claim 11 further comprising a first clock input node coupled to a control input node of one of the series connected pullup devices.

28. The latch circuit of claim 27 further comprising a second clock input node coupled to a control input node of one of the series connected pulldown devices.

\* \* \* \* \*

UNITED STATES PATENT AND TRADEMARK OFFICE
CERTIFICATE OF CORRECTION

PATENT NO. : 6,483,363 B1
DATED : November 19, 2002
INVENTOR(S) : Karnik et al.

It is certified that error appears in the above-identified patent and that said Letters Patent is hereby corrected as shown below:

<u>Title page, Item [54] and Column 1, line 1,</u>
Delete "STOCK" and insert -- STACK --, therefor.

<u>Column 3,</u>
Line 13, delete "more filly" and insert -- more fully --, therefor.

Signed and Sealed this

Thirteenth Day of May, 2003

JAMES E. ROGAN
*Director of the United States Patent and Trademark Office*